United States Patent [19]

Bussiere et al.

[11] Patent Number: 4,820,981

[45] Date of Patent: Apr. 11, 1989

[54] METHOD AND APPARATUS FOR MEASURING MAGNETIC LOSSES IN FERROMAGNETIC MATERIALS BASED ON TEMPERATURE MODULATION MEASUREMENTS

[75] Inventors: Jean F. Bussiere, St-Bruno; Martin Lord, Longueuil; Jean-Pierre Monchalin, Montreal, all of Canada

[73] Assignee: Canadian Patents and Development Limited/Societe Canadienne des Brevets et d'Exploitation Limitee, Ottawa, Canada

[21] Appl. No.: 137,933

[22] Filed: Dec. 28, 1987

[30] Foreign Application Priority Data

Dec. 29, 1986 [CA] Canada .................................. 526373

[51] Int. Cl.$^4$ ...................... G01R 33/14; G01N 27/72; H04L 27/10
[52] U.S. Cl. .................................. 324/222; 324/226; 324/260; 374/45
[58] Field of Search ............... 324/222, 223, 228, 226, 324/227, 232, 233, 260, 262; 374/4, 5, 45

[56] References Cited

U.S. PATENT DOCUMENTS

| | | |
|---|---|---|
| 2,673,326 | 3/1954 | Stauffer .................................. 374/45 |
| 3,360,466 | 12/1967 | Short . |
| 3,382,704 | 5/1968 | Morris . |
| 3,736,500 | 5/1973 | Berkowitz et al. . |
| 4,309,610 | 1/1982 | Hillemeier . |
| 4,497,209 | 2/1985 | Kwun et al. . |

FOREIGN PATENT DOCUMENTS 0905765  2/1982  U.S.S.R. .............................. 324/232

OTHER PUBLICATIONS

"Photoacoustics and Photoacoustic Spectroscopy", A. Rosencwaig, J. Wiley publication (1980).
"Thermo-optical spectroscopy: Detection by the 'mirage effect'", A. C. Boccara et al, Applied Physics Letters, pp. 130–132, vol. 36 (1980).
"Photothermal spectroscopy using optical beam probing:Mirage effect", J. C. Murphy et al, Journal of Applied Physics, pp. 4580–4588, vol. 51 (1980).

Primary Examiner—Reinhard J. Eisenzopf
Assistant Examiner—Walter E. Snow
Attorney, Agent, or Firm—Foley & Lardner, Schwartz, Jeffery, Schwaab, Mack, Blumenthal & Evans

[57] ABSTRACT

The invention is concerned with a method and apparatus for measuring magnetic losses in a ferromagnetic material specimen. According to the invention, an alternating magnetic field having a predetermined frequency and an amplitude which is modulated at a frequency lower than the predetermined frequency is applied to the specimen, and a temperature modulation at a surface of the specimen having the applied field is measured. The magnitude of magnetic losses in the specimen is determined from the measured surface temperature modulation. The method and apparatus of the invention do not necessitate winding coils around the ferromagnetic material specimen, and also enable one to obtain information about the distribution of magnetic losses in the specimen.

22 Claims, 2 Drawing Sheets

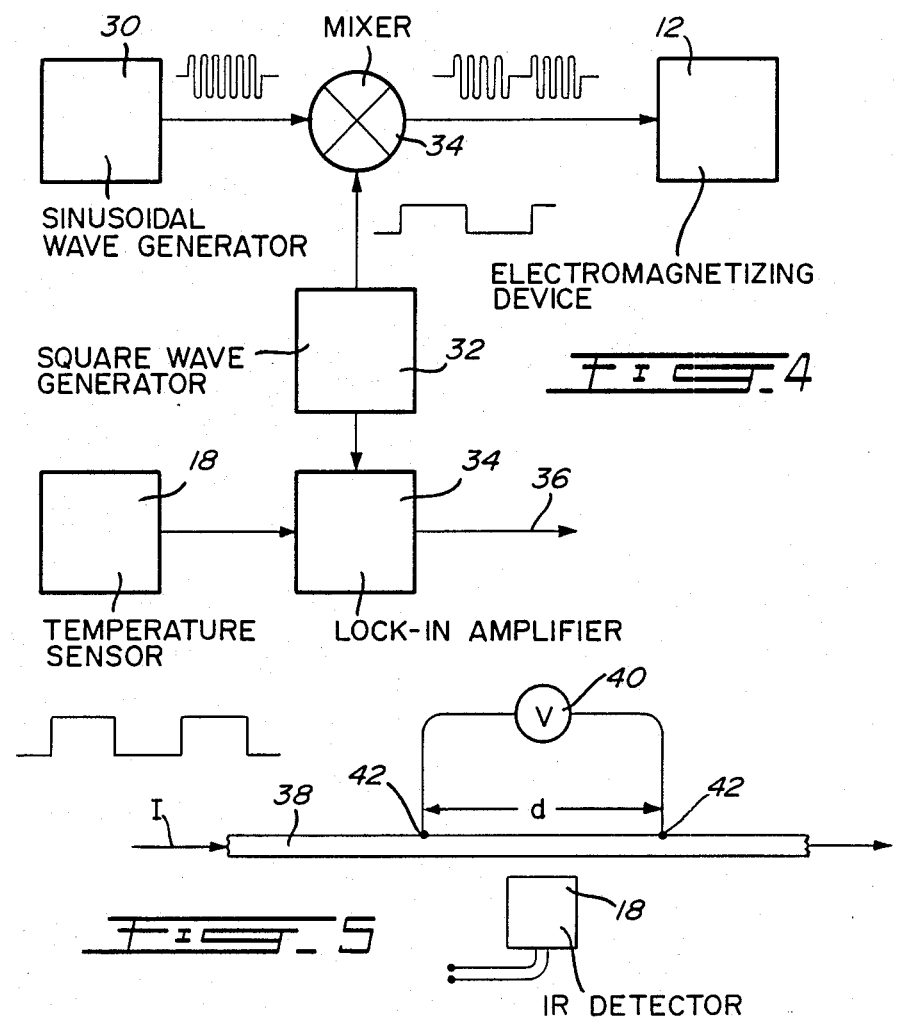
FIG. 4
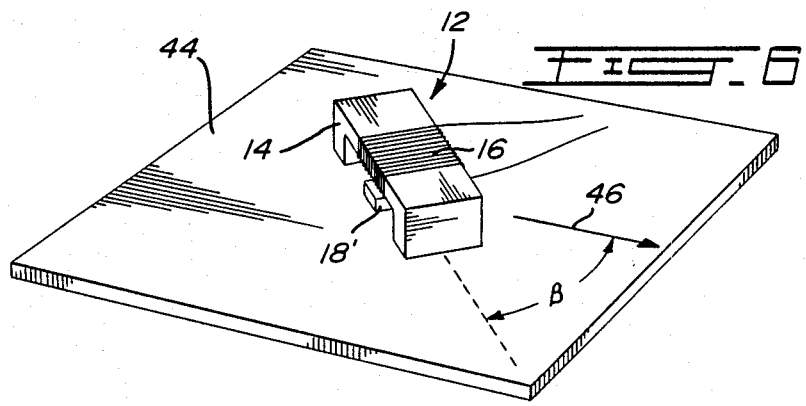
FIG. 5
FIG. 6

METHOD AND APPARATUS FOR MEASURING MAGNETIC LOSSES IN FERROMAGNETIC MATERIALS BASED ON TEMPERATURE MODULATION MEASUREMENTS

BACKGROUND OF THE INVENTION

The present invention relates to a method and apparatus for measuring magnetic losses in ferromagnetic materials.

Ferromagnetic materials are used in a large number of electrical devices functioning with alternating current. Two main applications are for transformers and electrical motors. An important consideration in the choice of ferromagnetic material for such applications is the level of magnetic loss which occurs as a result of eddy currents and magnetic hysteresis. For this reason, much effort has been devoted over the years to the development of low loss ferromagnetic materials such as oriented Fe-3%Si steel and more recently amorphous magnetic materials. Many of these materials are presently sold with specified magnetic losses usually rated for a given frequency and peak magnetic induction.

Magnetic losses are generally measured using electromagnetic measurements. The standard technique used in the silicon steel industry is based on placing 3 cm wide by 25 cm long strips of the sample in a standard Epstein frame (ASTM standard) which includes coils for generating a magnetic field and coils for measuring the resulting magnetic induction in the sample. In this measurement, the exiting magnetic field H is deduced from the current and number of turns in a primary circuit of the Epstein frame and the magnetic induction B is deduced from a secondary coil also wound around the sample.

Magnetic losses can also be measured on-line, for example during fabrication of large strips of ferromagnetic material, by using suitable coils to produce a magnetic field H in the material and to measure the magnetic induction B. These techniques are rapid, accurate, sensitive and well accepted in the industry. However, they have some limitations:

(1) they require good simultaneous measurements of both the magnetic field H and magnetic induction B, which necessitate in some cases (e.g. for on-line measurements) complicated coil geometries;

(2) since it is necessary for the coils to surround the material undergoing measurement, magnetic losses are usually an average over the entire coil area and it is next to impossible to measure losses locally, for instance near edges or at the center of a large plate.

SUMMARY OF THE INVENTION

It is therefore an object of the present invention to overcome the above drawbacks and to provide a method and apparatus for measuring magnetic losses in a ferromagnetic material specimen, which do not necessitate winding coils around the specimen.

It is another object of the invention to provide such a method and apparatus which also enable one to obtain information about the distribution of magnetic losses in the ferromagnetic material specimen.

In accordance with the present invention, there is thus provided a method of measuring magnetic losses in a ferromagnetic material specimen, comprising the steps of:

(a) applying to the specimen an alternating magnetic field having a predetermined frequency and an amplitude which is modulated at a frequency lower than the predetermined frequency;

(b) measuring a temperature modulation at a surface of the specimen having the applied field; and (c) determining the magnitude of magnetic losses in the specimen from the measured surface temperature modulation.

The present invention also provides, in another aspect thereof, an apparatus for carrying out a method as defined above, which comprises:

magnetizing means for generating an alternating magnetic field having a predetermined frequency and an amplitude which is modulated at a frequency lower than the predetermined frequency, and applying such a magnetic field to the ferromagnetic material specimen, and temperature sensing means for measuring a temperature modulation at a surface of the specimen having the applied field, whereby the magnitude of magnetic losses in the specimen is determined from the measured surface temperature modulation.

According to a preferred embodiment of the invention, the surface temperature modulation is measured at the frequency of modulation of the magnetic field. This enables one to obtain a measurement value which is substantially proportional to the magnitude of magnetic losses in the specimen.

The alternating magnetic field which is applied to the ferromagnetic material specimen generally has a frequency ranging from about 1 Hz to about 500 KHz and an amplitude modulated at a frequency which is at least ten times lower than the frequency of the alternating magnetic field. A magnetic field having a frequency of about 60 Hz is of course preferred as it can be generated from the readily available 60 Hz alternating current, and where such a magnetic field is utilized its amplitude is preferably modulated at a frequency of about 1 Hz.

The necessary magnetic field can be generated using an electromagnetizing device comprising a ferromagnetic core about which is wound an electric coil and energizing the electric coil with an amplitude modulated alternating current obtained for example by mixing a sinusoidal signal with a square wave type modulation signal of lower frequency. As a result, an alternating magnetic field is obtained having a constant amplitude during the "on" part of the signal.

The temperature sensing means, on the other hand, can be of the contact or non-contact type. Examples of suitable contact temperature sensors are the sensitive contact thermometers made of polyelectric films. It is also possible to use a non-contact temperature sensor such as an infrared detector which views the specimen surface and is coupled with a calibrating device allowing a calibration of the temperature sensor according to the surface emissivity. Another very sensitive non-contact temperature sensor comprises a closed cell filled with gas such as ambient air and provided with a microphone. It is known that, for such a sensor, the pressure variation within the cell detected through a suitable aperture by the microphone is directly proportional to the temperature variation at the surface of the specimen (see for example "Photoacoustics and Photoacoustic Spectroscopy" by A. Rosencwaig, J. Wiley Pub. (1980)).

A further example of non-contact temperature sensor which can be utilized in the present invention uses the deflection of a laser beam generated by a laser and propagating close to the surface of the specimen, and has been described in "Thermo-optical spectroscopy: Detection by the mirage effect", by A. C. Boccara, D. Fournier and J. Badoz in Applied Physics Letters, pp. 130–132, vol. 36 (1980), and "Photothermal spectroscopy using optical beam probing: Mirage effect", by J. D. Murphy and L. C. Aamodt in the Journal of Applied Physics, pp. 4580–4588, vol. 51 (1980). The heat at the surface of the specimen deflects the laser beam, which deflection is a function of the surface temperature. In a known manner, a knife edge along with an optical detector allows to determine this deflection and to thereby measure the temperature modulation at the surface of the specimen.

As mentioned above, in order to obtain a measurement value which is substantially proportional to the magnitude of magnetic losses in the ferromagnetic material specimen, the surface temperature modulation is preferably measured at the frequency of modulation of the alternating magnetic field. This can be done by amplifying the signal from the temperature sensor with a lock-in amplifier synchronized with the modulation signal, the output signal of the amplifier thus being proportional to the magnetic losses.

An absolute calibration of the signal from the temperature sensor, in terms of magnetic losses per unit volume, can be obtained by using a strip of metal having the same emissivity as the ferromagnetic material specimen whose magnetic losses are to be measured and placing such a metal strip at the same location with respect to the temperature sensor as the specimen. A DC current I which is modulated at the same frequency as the frequency of modulation of the magnetic field is then passed in the strip and the voltage V is measured with a phase-sensitive voltmeter using voltage probes which are in contact with the metal strip and spaced one from another by a distance d. The power P dissipated per unit volume during the "on" part of the modulated DC signal is given by the following equation:

$$P = VI/d\, w\, t$$

where w and t are the width and thickness of the strip, respectively. The signal from the temperature sensor is amplified with a lock-in amplifier synchronized with the modulated DC signal and is thus calibrated in energy loss per unit volume for the material being measured.

The use of an amplitude modulated alternating magnetic field eliminates parasitic temperature variations due to the environment and allows phase sensitive synchronous detection by the lock-in amplifier, resulting in a substantial increase of the signal-to-noise ratio. Moreover, by varying the frequency of modulation, one can thermally probe different depths of the ferromagnetic material specimen.

The method and apparatus of the invention are particularly useful for measuring magnetic losses where it is advantageous not to wind coils around the specimen or where information about the distribution of losses is desired, and also for characterizing materials. With respect to the latter application, magnetic losses in ferromagnetic materials depend on microstructural defects such as processed crystallographic orientation and the presence of small defects such as inclusions, grain boundaries, dislocation, etc. resulting from processing. Measurements of magnetic losses can therefore be used to determine certain microstructural parameters or mechanical properties such as preferred crystallographic orientation (texture) and resulting anisotropy, hardness, tensile strength, etc. By varying the magnetic field frequency which determines the electromagnetic penetration inside the material or the frequency of modulation which determines the thermal penetration, the material can be readily probed at different depths.

BRIEF DESCRIPTION OF THE DRAWINGS

Further features and advantages of the invention will become more readily apparent from the following description of preferred embodiments as illustrated by way of example in the accompanying drawings, in which:

FIG. 4 is a schematic diagram of an electronic circuit used for measuring the magnetic losses;

FIG. 5 is a schematic representation of an embodiment permitting an absolute calibration of the signal from the temperature sensor, in terms of magnetic losses per unit volume; and FIG. 6 is a perspective view illustrating another application of the invention, directed to measuring anisotropy in a steel sheet.

DESCRIPTION OF PREFERRED EMBODIMENTS

Figure 1:
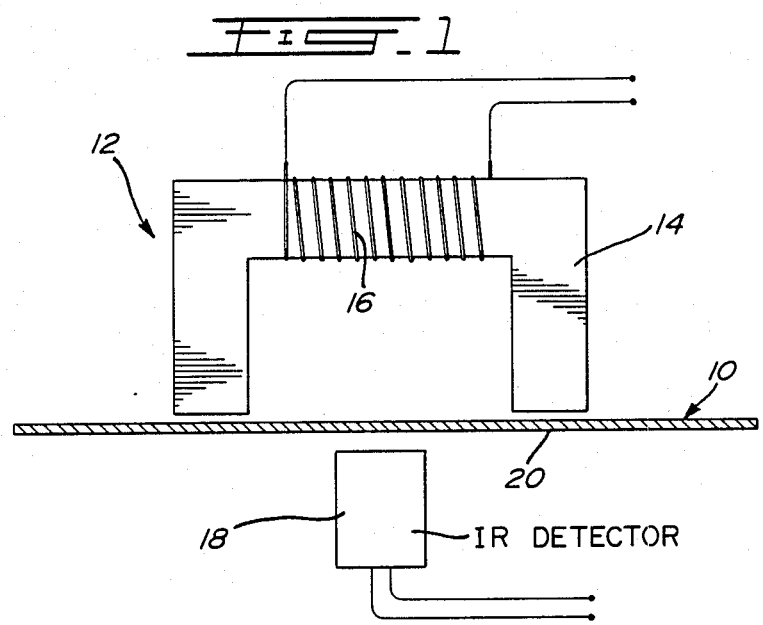
FIG. 1 schematically illustrates a magnetizing device and a non-contact temperature sensor used for measuring magnetic losses in a ferromagnetic material specimen, according to the invention.
Figure 2:
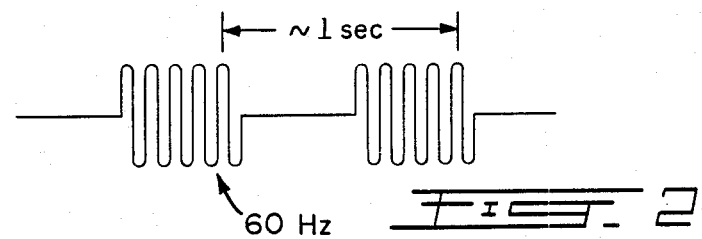
FIG. 2 is a schematic representation of a preferred current waveform in the magnetizing device shown in FIG. 1.

Referring first to FIG. 1, there is illustrated an apparatus for measuring magnetic losses in a ferromagnetic material specimen 10, including an electromagnetizing device 12 comprising a U-shaped ferromagnetic core 14 and an electric coil 16 wound about the core 12. The device 12 is adapted to generate an alternating magnetic field having a predetermined frequency and an amplitude modulated at a frequency lower than the predetermined frequency. Such a magnetic field is applied to the specimen 10 and can be produced by energizing the coil 16 with an amplitude-modulated alternating current. A preferred current waveform which may be applied to the coil 16 is shown in FIG. 2. A non-contact temperature sensor 18 such as an infrared detector is provided for measuring the temperature modulation at the surface 20 of the specimen having the applied field.

Figure 3:
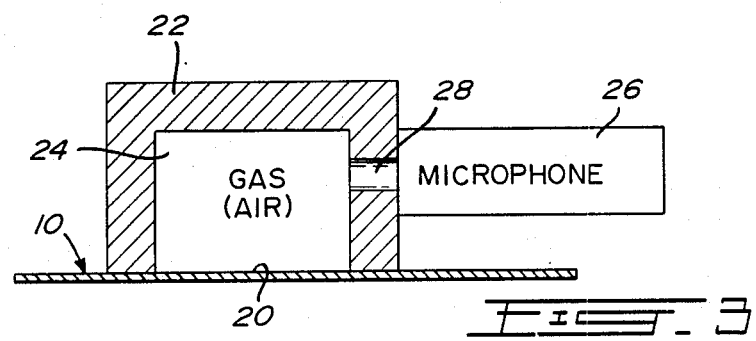
FIG. 3 schematically illustrates another type of non-contact temperature sensor.

FIG. 3 shows another type of non-contact temperature sensor which may be used in accordance with the invention. As shown, such a temperature sensor comprises an enclosure 22 defining with the surface 20 of the specimen 10 a closed cell 24 which is filled with gas such as ambient air and is in gas flow communication with a microphone 26 via a suitable aperture 28. As it is known, the pressure variation within the cell 24 detected through the aperture 28 by the microphone 26 is directly proportional to the temperature variation at the surface 20 of the specimen.

Turning to FIG. 4 which schematically represents the electronic circuit used for applying the desired current waveform to the electromagnetizing device 12 and for processing the signal from the temperature sensor 18, a variable frequency sinusoidal wave generator 30 is provided for generating a sinusoidal signal having a frequency of, for example, 60 Hz. A variable frequency square wave generator 32 is also provided for generating a square wave type modulation signal of lower frequency, for example 1 Hz. The output signals of both generators 30 and 32 are passed through a mixer 34 for providing an amplitude-modulated or chopped sinusoidal signal which is then applied to the electromagnetizing device 12. The output signal of the temperature sensor 18, on the other hand, is amplified with a lock-in amplifier 34 which is synchronized with the modulation signal from the square wave generator 32. As a result, the output signal 36 of the amplifier 34 is proportional to the magnetic losses in the ferromagnetic material specimen.

FIG. 5 illustrates how an absolute calibration of the signal from the temperature sensor 18, in terms of magnetic losses per unit volume, can be obtained. A strip of metal 38 having the same emissivity as the ferromagnetic material specimen whose magnetic losses are to be measured is placed at the same location with respect to the temperature sensor 18 as the specimen. A DC current I having an amplitude modulated at the same frequency as above is passed in the strip 38 and the voltage is measured with a phase-sensitive voltmeter 40 using voltage probes 42 which are in contact with the strip 38 and spaced one from another by a distance d. As previously mentioned, the power P dissipated per unit volume during the "on" part of the signal is equal to:

$$P = VI/d\,w\,t$$

where w and t are the width and thickness of the strip 38, respectively. The signal from the temperature sensor 18 is amplified with a lock-in amplifier (not shown) synchronized with the amplitude-modulated DC signal and is thus calibrated in energy loss per unit volume for the material being measured.

An example of a possible application for measuring anisotropy in a steel sheet is shown in FIG. 6. The electromagnetizing device 12 is placed on the steel sheet 44 with a contact type temperature sensor 18' placed as shown. The signal from the temperature sensor 18' is then recorded as a function of the angle B between the device 12 and the rolling direction of the metal sheet represented by the arrow 46. The degree by orientation or anisotropy is determined by measuring the relative change of amplitude with angle B.

Presently such measurements are made by placing small discs in a rotating field, a technique which requires destructive sampling.

The embodiment shown in FIG. 6 can also be used to characterize other metals in different shapes, such as fasteners, cast steel pieces, etc., by adapting the configuration of the electromagnetizing device 12 and the temperature sensor 18'. Empirical correlations with material properties are then established on calibrated materials.

We claim:

1. A method of measuring magnetic losses in a ferromagnetic material specimen, comprising the steps of:
   (a) applying to the specimen an alternating magnetic field having a predetermined frequency and an amplitude which is modulated at a frequency lower than said predetermined frequency, to thereby cause in said specimen a modulation in temperature at the frequency of modulation of said magnetic field;
   (b) measuring the temperature modulation at a surface of said specimen having the applied field, at the frequency of modulation of said magnetic field to obtain a measurement value which is substantially proportional to the magnitude of magnetic losses; and
   (c) determining the magnitude of magnetic losses in said specimen from said measurement value.

2. A method as claimed in claim 1, wherein said predetermined frequency ranges from about 1 hz to about 500 KHz.

3. A method as claimed in claim 1, wherein the modulation frequency is at least ten times lower than said predetermined frequency.

4. A method as claimed in claim 1, wherein said predetermined frequency is about 60 Hz and said modulation frequency is about 1 Hz.

5. A method as claimed in claim 1, wherein said magnetc field is generated by means of an electromagnetizing device comprising a ferromagnetic core and an electric coil wound about said core, said electric coil being energized with an alternating current having said predetermined frequency and an amplitude modulated at said modulation frequency.

6. A method as claimed in claim 5 wherein said alternating current is a sinusoidal signal mixed with a square wave type modulation signal of lower frequency.

7. A method as claimed in claim 1, wherein the surface temperature modulation is measured by means of a contact temperature sensor adapted to provide an electrical output signal indicative of the surface temperature sensed.

8. A method as claimed in claim 1, wherein the surface temperature modulation is measured by means of a non-contact temperature sensor adapted to provide an electrical output signal indicative of the surface temperature sensed.

9. A method as claimed in claim 7, wherein the output signal of said temperature sensor is amplified with a lock-in amplifier locked in at said modulation frequency.

10. A method as claimed in claim 8, wherein the output signal of said temperature sensor is amplified with a lock-in amplifier locked in at said modulation frequency.

11. An apparatus for measuring magnetic losses in a ferromagnetic material specimen, which comprises:
    magnetizing means for generating an alternating magnetic field having a predetermined frequency and an amplitude which is modulated at a frequency lower than said predetermined frequency, and applying said magnetic field to the ferromagnetic material specimen to thereby cause in said specimen a modulation in temperature at the frequency of modulation of said magnetic field, and
    temperature sensing means for measuring the temperature modulation at a surface of said specimen having the applied field, at the frequency of modulation of said magnetic field to obtain a measurement value which is substantially proportional to the magnitude of magnetic losses,
    whereby the magnitude of magnetic losses in the specimen is determined from said measurement value.

12. An apparatus as claimed in claim 11, wherein said predetermined frequency ranges from about 1 Hz to about 500 KHz.

13. An apparatus as claimed in claim 11, wherein the modulation frequency is at least ten times lower than said predetermined frequency.

14. An apparatus as claimed in claim 11, wherein said predetermined frequency is about 60 Hz and said modulation frequency is about 1 Hz.

15. An apparatus as claimed in claim 11, wherein said magnetizing means comprises an electromagnetizing device including a ferromagnetic core and an electric coil wound about said core, and wherein said electric coil is connected to electrical power source means for energizing said coil with an alternating current having said predetermined frequency and an amplitude modulated at said modulation frequency.

16. An apparatus as claimed in claim 15, wherein said alternating current is a sinusoidal signal mixed with a square wave type modulation signal of lower frequency.

17. An apparatus as claimed in claim 11, wherein said temperature sensing means comprises a contact temperature sensor having an output providing an electrical output signal indicative of the surface temperature sensed.

18. An apparatus as claimed in claim 11, wherein said temperature sensing means comprises a noncontact temperature sensor having an output providing an electrical output signal indicative of the surface temperature sensed.

19. An apparatus as claimed in claim 18, wherein said non-contact temperature sensor comprises an infrared detector coupled with a calibrating device allowing a calibration of said detector according to surface emissivity.

20. An apparatus as claimed in to claim 17, wherein the output of said temperature sensor is connected to a lock-in amplifier locked in at said modulation frequency for amplifying the output signal of said temperature sensor and providing an amplified output signal which is substantially proportional to the magnetic losses.

21. An apparatus as claimed in to claim 18, wherein the output of said temperature sensor is connected to a lock-in amplifier locked in at said modulation frequency for amplifying the output signal of said temperature sensor and providing an amplified output signal which is substantially proportional to the magnetic losses.

22. An apparatus as claimed in to claim 19, wherein the output of said temperature sensor is connected to a lock-in amplifier locked in at said modulation frequency for amplifying the output signal of said temperature sensor and providing an amplified output signal which is substantially proportional to the magnetic losses.

* * * * *